(12) United States Patent
Zou et al.

(10) Patent No.: US 11,723,178 B2
(45) Date of Patent: Aug. 8, 2023

(54) POWER GRID-FRIENDLY CONTROL METHOD AND SYSTEM FOR DATA CENTER COOLING SYSTEM

(71) Applicants: State Grid Jiangsu Electric Power Co., Ltd. Information & Telecommunication Branch, Jiangsu (CN); State Grid Jiangsu Electric Power Co., Ltd., Jiangsu (CN)

(72) Inventors: Haodong Zou, Jiangsu (CN); Mingming Zhang, Jiangsu (CN); Ling Zhuang, Jiangsu (CN); Fei Xia, Jiangsu (CN); Jinling He, Jiangsu (CN); Guoquan Yuan, Jiangsu (CN); Zheng Lou, Jiangsu (CN); Ran Zhao, Jiangsu (CN); Lei Fan, Jiangsu (CN); Xinwen Shan, Jiangsu (CN); Yuanhan Du, Jiangsu (CN); Ming Tang, Jiangsu (CN); Ling Wang, Jiangsu (CN); Linjiang Shang, Jiangsu (CN)

(73) Assignees: State Grid Jiangsu Electric Power Co., Ltd. Information & Telecommunication Branch, Nanjing (CN); State Grid Jiangsu Electric Power Co., Ltd., Nanjing (CN)

(*) Notice: Subject to any disclaimer, the term of this patent is extended or adjusted under 35 U.S.C. 154(b) by 2 days.

(21) Appl. No.: 17/540,211

(22) Filed: Dec. 1, 2021

(65) Prior Publication Data
US 2022/0408614 A1    Dec. 22, 2022

Related U.S. Application Data

(63) Continuation of application No. PCT/CN2021/125488, filed on Oct. 22, 2021.

(30) Foreign Application Priority Data

Jun. 22, 2021  (CN) .......................... 202110692407.5

(51) Int. Cl.
 *H05K 7/20* (2006.01)
(52) U.S. Cl.
 CPC .............................. *H05K 7/20836* (2013.01)
(58) Field of Classification Search
 CPC ...... G06F 1/206; G06F 3/0665; G06F 9/4893; G06F 1/3296; G06F 1/3287; G06F 1/324;
 (Continued)

(56) References Cited

U.S. PATENT DOCUMENTS

| 8,103,388 B2 * | 1/2012 | Goodnow | ............. G06F 1/3203 |
| | | | 700/286 |
| 8,447,993 B2 * | 5/2013 | Greene | ................... G06Q 10/00 |
| | | | 713/340 |

(Continued)

FOREIGN PATENT DOCUMENTS

| CN | 102213475 A | 10/2011 |
| CN | 103615782 A | 3/2014 |

*Primary Examiner* — Darrin D Dunn

(57) ABSTRACT

Disclosed are a power grid-friendly control method and system for a data center cooling system. The method includes: dividing an equipment room into a plurality of pieces of subspace in advance, with a plurality of servers and a cooling device comprised in each piece of subspace; obtaining total power consumption of the servers in each piece of subspace; performing priority sorting on the total power consumption of the servers in each piece of subspace; obtaining a real-time power supply energy consumption value of a power grid; determining, whether an energy supply is sufficient; and if the energy supply is sufficient, skipping turning off the cooling device in the subspace; or if the energy supply is not sufficient, turning off a cooling device, till it is determined that the energy supply is suffi- (Continued)

cient, thus minimizing impact of turning off the cooling system on stability.

6 Claims, 2 Drawing Sheets

(58) Field of Classification Search
CPC ........ G06F 11/3006; G06F 1/189; G06F 1/30; G06F 2201/86; G06F 1/3203; Y02D 10/00; G05B 15/02; G05B 19/042; G05B 19/418; Y02B 70/3225; Y04S 10/50; Y04S 10/52; Y04S 20/222; Y02P 90/82; H05K 7/20836
See application file for complete search history.

(56) References Cited

U.S. PATENT DOCUMENTS

| | | | | |
|---|---|---|---|---|
| 2009/0125737 A1* | 5/2009 | Brey | ............ | G06F 1/3203 713/320 |
| 2009/0235097 A1* | 9/2009 | Hamilton | ............ | G06F 1/3203 713/320 |
| 2010/0191385 A1* | 7/2010 | Goodnow | ............ | G06F 1/3203 700/291 |
| 2010/0211810 A1* | 8/2010 | Zacho | ............ | G06F 1/3203 713/320 |
| 2013/0080799 A1* | 3/2013 | Artman | ............ | G06F 1/206 713/300 |
| 2014/0185225 A1* | 7/2014 | Wineland | ............ | H05K 7/20745 361/679.31 |
| 2019/0332164 A1* | 10/2019 | Sinha | ............ | G06F 1/3225 |

* cited by examiner

POWER GRID-FRIENDLY CONTROL METHOD AND SYSTEM FOR DATA CENTER COOLING SYSTEM

CROSS REFERENCE TO RELATED APPLICATIONS

The present application is a Continuation application of PCT Application No. PCT/CN2021/125488 filed on Oct. 22, 2021, which claims the benefit of Chinese Patent Application No. 202110692407.5 filed on Jun. 22, 2021. All the above are hereby incorporated by reference in their entirety.

TECHNICAL FIELD

The present disclosure relates to a power grid-friendly control method and system for a data center cooling system, and belongs to the technical field of automation control.

BACKGROUND

Cooling devices account for about 40% of total energy consumption of a data center. The huge energy consumption causes a great burden on a power grid, and as a result, the power grid often cannot ensure timely power supply. When an energy supply is insufficient, the cooling devices need to be adjusted or even turned off frequently. Therefore, it is very important to select an appropriate sequence of turning off the cooling devices.

When no sufficient power is supplied to the data center, it is usually impossible to uniformly reduce power consumption of a cooling system in each compartment. In this case, measures need to be taken for an equipment room to reduce energy consumption. A common means is to turn off some cooling devices.

If a cooling demand of a compartment in the equipment room cannot be sensed, an operator does not know how to safely turn off the cooling devices. Different compartments have different cooling demands due to different server power consumption and business volumes. Therefore, if the operator reduces a cooling capacity on average, a compartment with large business load will have a risk of overheating.

SUMMARY

To overcome the defects in the prior art, the present disclosure provides a power grid-friendly control method and system for a data center cooling system.

To resolve the above technical problem, the present disclosure provides a power grid-friendly control method for a data center cooling system, including:

dividing an equipment room into a plurality of pieces of subspace in advance, with a plurality of servers and a cooling device comprised in each piece of subspace;

obtaining total power consumption of the servers in each piece of subspace;

performing priority sorting on the total power consumption of the servers in each piece of subspace based on a principle that lower total power consumption of the servers leads to a higher priority of turning off the cooling device; and obtaining a real-time power supply energy consumption value of a power grid; determining, based on the real-time power supply energy consumption value of the power grid, whether an energy supply is sufficient; and if the energy supply is sufficient, skipping turning off the cooling device in the subspace; or if the energy supply is not sufficient, turning off a cooling device in corresponding subspace based on a priority sorting result, till it is determined that the energy supply is sufficient.

Further, the dividing an equipment room into a plurality of pieces of subspace in advance, with a plurality of servers and a cooling device included in each piece of subspace, includes:

dividing the equipment room into the plurality of pieces of subspace, dividing each piece of subspace into a plurality of pieces of server space by a position of the cooling device as a center, and adding the servers to different server space.

Further, the obtaining a real-time power supply energy consumption value of a power grid; determining, based on the real-time power supply energy consumption value of the power grid, whether an energy supply is sufficient; and if the energy supply is sufficient, skipping turning off the cooling device in the subspace; or if the energy supply is not sufficient, turning off a cooling device in corresponding subspace based on a priority sorting result, till it is determined that the energy supply is sufficient, includes:

obtaining a real-time supply voltage $V_{reduced}$ of the power grid and a preset supply voltage $V_{standard}$ in the case of normal power supply;

when the real-time supply voltage $V_{reduced}$ of the power grid is not less than the preset supply voltage $V_{standard}$ in the case of normal power supply, skipping turning off the cooling device in the subspace; or when the real-time supply voltage V reduced of the power grid is less than the preset supply voltage V standard in the case of normal power supply, calculating a power consumption reduction value $\Delta P_{reduce}$ according to the following formula:

$$\Delta P_{reduce} = \left(1 - \frac{V_{reduced}}{V_{standard}}\right) * P_{standard}$$

where $P_{standard}$ represents total power in the case of normal power supply; and determining, based on the power consumption reduction value $\Delta P_{reduce}$, the obtained total power consumption of the servers in each piece of subspace, and the priority sorting result, the cooling device that needs to be turned off in the subspace.

Further, the determining, based on the power consumption reduction value $\Delta P_{reduce}$, the obtained total power consumption of the servers in each piece of subspace, and the priority sorting result, the cooling device that needs to be turned off in the subspace includes:

if the priority sorting result is expressed as follows:

$$L_{all} = [P_{air\ conditioner\_1}, P_{air\ conditioner\_2} \cdots P_{air\ conditioner\_N}]$$

selecting k pieces of subspace in descending order of priorities in the priority sorting result, where the k pieces of subspace are as follows:

$$L_k = [P_{air\ conditioner\_1}, P_{air\ conditioner\_2} \cdots P_{air\ conditioner\_k}];$$

the following conditions are met:

$$\sum_{i=1}^{k} P_{air\ conditioner\_i} \geq \Delta P_{reduce}, \text{ and}$$

$$\sum_{i=1}^{k-1} P_{air\ conditioner\_i} < \Delta P_{reduce};$$

$P_{air\ conditioner\_n}$ represents total power consumption of servers in subspace corresponding to an $n^{th}$ level, n=1, 2, . . . , N, and N represents a level corresponding to a cooling device that is turned off last; and $$\sum_{i=1}^{k} P_{air\ conditioner\_i}$$

represents a sum of total power consumption of servers in the k pieces of subspace, and $$\sum_{i=1}^{k-1} P_{air\ conditioner\_i}$$

represents a sum of total power consumption of servers in (k−1) pieces of subspace.

A power grid-friendly control system for a data center cooling system includes:

a dividing module, configured to divide an equipment room into a plurality of pieces of subspace in advance, with a plurality of servers and a cooling device included in each piece of subspace;

a first obtaining module, configured to obtain total power consumption of the servers in each piece of subspace;

a sorting module, configured to perform priority sorting on the total power consumption of the servers in each piece of subspace based on a principle that lower total power consumption of the servers leads to a higher priority of turning off the cooling device; and a control module, configured to: obtain a real-time power supply energy consumption value of a power grid; determine, based on the real-time power supply energy consumption value of the power grid, whether an energy supply is sufficient; and if the energy supply is sufficient, skip turning off the cooling device in the subspace; or if the energy supply is not sufficient, turn off a cooling device in corresponding subspace based on a priority sorting result, till it is determined that the energy supply is sufficient.

Further, the dividing module is configured to divide the equipment room into the plurality of pieces of subspace, divide each piece of subspace into a plurality of pieces of server space by a position of the cooling device as a center, and add the servers to different server space.

Further, the control module includes:

a second obtaining unit, configured to obtain a real-time supply voltage $V_{reduced}$ of the power grid and a preset supply voltage $V_{standard}$ in the case of normal power supply;

a calculation unit, configured to: when the real-time supply voltage $V_{reduced}$ of the power grid is not less than the preset supply voltage $V_{standard}$ in the case of normal power supply, skip turning off the cooling device in the subspace; or when the real-time supply voltage $V_{reduced}$ of the power grid is less than the preset supply voltage $V_{standard}$ in the case of normal power supply, calculate a power consumption reduction value $\Delta P_{reduce}$ according to the following formula:

$$\Delta P_{reduce} = \left(1 - \frac{V_{reduced}}{V_{standard}}\right) * P_{standard}$$

where $P_{standard}$ represents total power in the case of normal power supply; and a determining unit, configured to determine, based on the power consumption reduction value $\Delta P_{reduce}$, the obtained total power consumption of the servers in each piece of subspace, and the priority sorting result, the cooling device that needs to be turned off in the subspace.

Further, the determining module includes:

a third obtaining unit, configured to obtain the priority sorting result that is expressed as follows:

$L_{all}=[P_{air\ conditioner\_1},P_{air\ conditioner\_2} \cdots P_{air\ conditioner\_N}]$; and a second determining unit, configured to determine k pieces of subspace in descending order of priorities in the priority sorting result, where the k pieces of subspace are as follows:

$L_k=[P_{air\ conditioner\_1},P_{air\ conditioner\_2} \cdots P_{air\ conditioner\_k}]$;

the following conditions are met:

$$\sum_{i=1}^{k} P_{air\ conditioner\_i} \geq \Delta P_{reduce}, \text{ and } \sum_{i=1}^{k-1} P_{air\ conditioner\_i} < \Delta P_{reduce};$$

$P_{air\ conditioner\_n}$ represents total power consumption of servers in subspace corresponding to an $n^{th}$ level, n=1, 2, . . . , N, and N represents a level corresponding to a cooling device that is turned off last; and $$\sum_{i=1}^{k} P_{air\ conditioner\_i}$$

represents a sum of total power consumption of servers in the k pieces of subspace, and $$\sum_{i=1}^{k-1} P_{air\ conditioner\_i}$$

represents a sum of total power consumption of servers in (k−1) pieces of subspace.

The present disclosure has the following beneficial effects:

When it is necessary to turn off a cooling system since to an insufficient power supply of the power grid, the present disclosure can determine workloads of servers in different regions based on IT power consumption of the servers, so as to turn off a regional cooling system with a light workload and minimize impact of turning off the cooling system on service stability.

DETAILED DESCRIPTION

The prevent disclosure is further described below with reference to the accompanying drawings. The following embodiments are only used for describing the technical solutions of the present disclosure more clearly, and are not intended to limit the protection scope of the present disclosure.

A power grid-friendly control method for a data center cooling system includes:

dividing an equipment room into a plurality of pieces of subspace in advance, with a plurality of servers and a cooling device included in each piece of subspace;

obtaining total power consumption of the servers in each piece of subspace;

performing priority sorting on the total power consumption of the servers in each piece of subspace based on a principle that lower total power consumption of the servers leads to a higher priority of turning off the cooling device; and obtaining a real-time power supply energy consumption value of a power grid; determining, based on the real-time power supply energy consumption value of the power grid, whether an energy supply is sufficient; and if the energy supply is sufficient, skipping turning off the cooling device in the subspace; or if the energy supply is not sufficient, turning off a cooling device in corresponding subspace based on a priority sorting result, till it is determined that the energy supply is sufficient.

Figure 1:
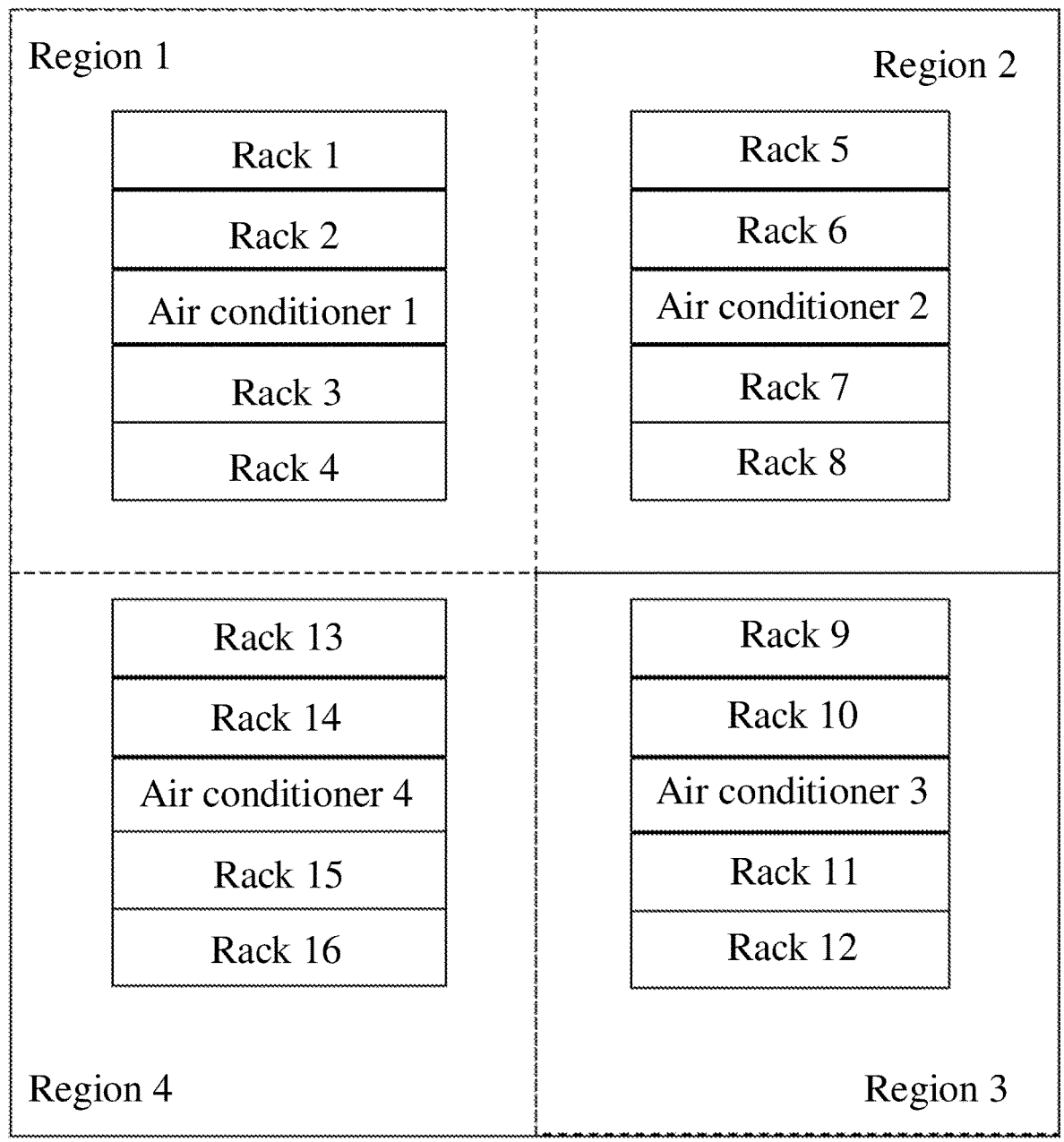
FIG. 1 shows a method for dividing a region into blocks.

As shown in FIG. 1, the dividing an equipment room into a plurality of pieces of subspace in advance, with a plurality of servers and a cooling device comprised in each piece of subspace, includes:

dividing the equipment room into the plurality of pieces of subspace, dividing each piece of subspace into a plurality of pieces of server space by a position of the cooling device as a center, and adding the servers to different server space.

Figure 2:
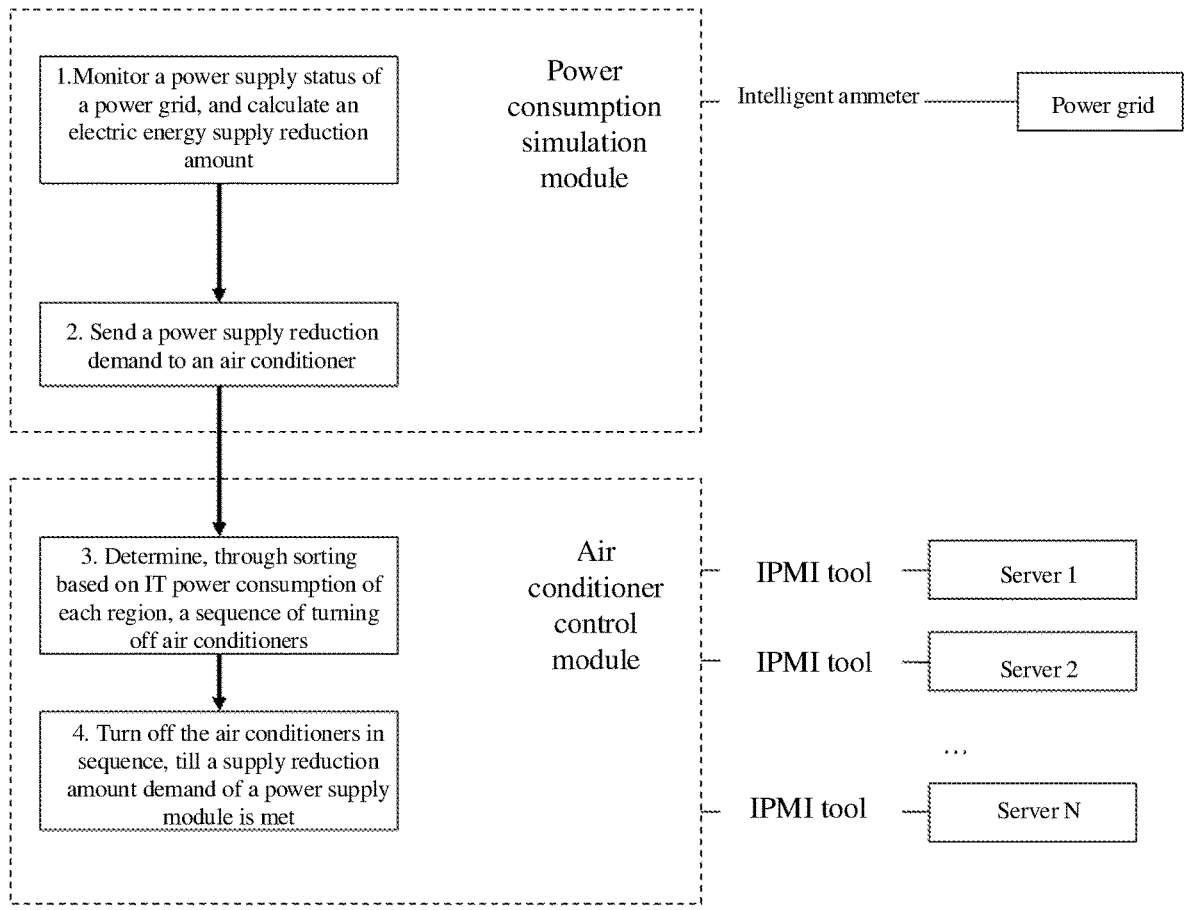
FIG. 2 is a specific flowchart of a method according to the present disclosure.

As shown in FIG. 2, the obtaining a real-time power supply energy consumption value of a power grid; determining, based on the real-time power supply energy consumption value of the power grid, whether an energy supply is sufficient; and if the energy supply is sufficient, skipping turning off the cooling device in the subspace; or if the energy supply is not sufficient, turning off a cooling device in corresponding subspace based on a priority sorting result, till it is determined that the energy supply is sufficient, includes:

obtaining a real-time supply voltage $V_{reduced}$ of the power grid and a preset supply voltage $V_{standard}$ in the case of normal power supply;

when the real-time supply voltage $V_{reduced}$ of the power grid is not less than the preset supply voltage $V_{standard}$ in the case of normal power supply, skipping turning off the cooling device in the subspace; or when the real-time supply voltage $V_{reduced}$ of the power grid is less than the preset supply voltage $V_{standard}$ in the case of normal power supply, calculating a power consumption reduction value $\Delta P_{reduce}$ according to the following formula:

$$\Delta P_{reduce} = \left(1 - \frac{V_{reduced}}{V_{standard}}\right) * P_{standard}$$

where $P_{standard}$ represents total power in the case of normal power supply; and determining, based on the power consumption reduction value $\Delta P_{reduce}$, the obtained total power consumption of the servers in each piece of subspace, and the priority sorting result, the cooling device that needs to be turned off in the subspace.

The determining, based on the power consumption reduction value $\Delta P_{reduce}$, the obtained total power consumption of the servers in each piece of subspace, and the priority sorting result, the cooling device that needs to be turned off in the subspace includes:

if the priority sorting result is expressed as follows:

$$L_{all} = [P_{air\ conditioner\_1}, P_{air\ conditioner\_2} \cdots P_{air\ conditioner\_n}]$$

selecting k pieces of subspace in descending order of priorities in the priority sorting result, where the k pieces of subspace are as follows:

$$L_k = [P_{air\ conditioner\_1}, P_{air\ conditioner\_2} \cdots P_{air\ conditioner\_k}];$$

the following conditions are met:

$$\sum_{i=1}^{k} P_{air\ conditioner\_i} \geq \Delta P_{reduce}, \text{ and } \sum_{i=1}^{k-1} P_{air\ conditioner\_i} < \Delta P_{reduce};$$

$P_{air\ conditioner\_n}$ represents total power consumption of servers in subspace corresponding to an $n^{th}$ level, n=1, 2, ..., N, and N represents a level corresponding to a cooling device that is turned off last; and $$\sum_{i=1}^{k} P_{air\ conditioner\_i}$$

represents a sum of total power consumption of servers in the k pieces of subspace, and $$\sum_{i=1}^{k-1} P_{air\ conditioner\_i}$$

represents a sum of total power consumption of servers in (k−1) pieces of subspace.

Correspondingly, the present disclosure further provides a power grid-friendly control system for a data center cooling system, including:

a dividing module, configured to divide an equipment room into a plurality of pieces of subspace in advance, with a plurality of servers and a cooling device included in each piece of sub space;

a first obtaining module, configured to obtain total power consumption of the servers in each piece of subspace;

a sorting module, configured to perform priority sorting on the total power consumption of the servers in each piece of subspace based on a principle that lower total power consumption of the servers leads to a higher priority of turning off the cooling device; and a control module, configured to: obtain a real-time power supply energy consumption value of a power grid; determine, based on the real-time power supply energy consumption value of the power grid, whether an energy supply is sufficient; and if the energy supply is sufficient, skip turning off the cooling device in the subspace; or if the energy supply is not sufficient, turn off a cooling device in corresponding subspace based on a priority sorting result, till it is determined that the energy supply is sufficient.

The dividing module is configured to divide the equipment room into the plurality of pieces of subspace, divide each piece of subspace into a plurality of pieces of server space by a position of the cooling device as a center, and add the servers to different server space.

The control module includes:

a second obtaining unit, configured to obtain a real-time supply voltage $V_{reduced}$ of the power grid and a preset supply voltage $V_{standard}$ in the case of normal power supply;

a calculation unit, configured to: when the real-time supply voltage $V_{reduced}$ of the power grid is not less than the preset supply voltage $V_{standard}$ in the case of normal power supply, skip turning off the cooling device in the subspace; or when the real-time supply voltage $V_{reduced}$ of the power grid is less than the preset supply voltage $V_{standard}$ in the case of normal power supply, calculate a power consumption reduction value $\Delta P_{reduce}$ according to the following formula:

$$\Delta P_{reduce} = \left(1 - \frac{V_{reduced}}{V_{standard}}\right) * P_{standard}$$

where $P_{standard}$ represents total power in the case of normal power supply; and a determining unit, configured to determine, based on the power consumption reduction value $\Delta P_{reduce}$, the obtained total power consumption of the servers in each piece of subspace, and the priority sorting result, the cooling device that needs to be turned off in the subspace.

The determining module includes:

a third obtaining unit, configured to obtain the priority sorting result that is expressed as follows:

$$L_{all} = [P_{air\ conditioner\_1}, P_{air\ conditioner\_2} \cdots P_{air\ conditioner\_N}]; \text{ and}$$

a second determining unit, configured to determine k pieces of subspace in descending order of priorities in the priority sorting result, where the k pieces of subspace are as follows:

$$L_k = [P_{air\ conditioner\_1}, P_{air\ conditioner\_2} \cdots P_{air\ conditioner\_k}];$$

the following conditions are met:

$$\sum_{k=1}^{k} P_{air\ conditioner\_i} \geq \Delta P_{reduce}, \text{ and } \sum_{k=1}^{k-1} P_{air\ conditioner\_i} < \Delta P_{reduce};$$

$P_{air\ conditioner\_n}$ represents total power consumption of servers in subspace corresponding to an $n^{th}$ level, n=1, 2, . . . , N, and N represents a level corresponding to a cooling device that is turned off last; and $$\sum_{k=1}^{k} P_{air\ conditioner\_i}$$

represents a sum of total power consumption of servers in the k pieces of subspace, and $$\sum_{k=1}^{k-1} P_{air\ conditioner\_i}$$

represents a sum of total power consumption of servers in (k−1) pieces of subspace.

The embodiments of the present disclosure further provide a power grid-friendly control system for a data center cooling system. The system includes a processor. The processor is configured to execute the above program modules and program units stored in a memory, including the dividing module, the first obtaining module, the sorting module, the control module, the second obtaining unit, the calculation unit, the determining unit, the third obtaining unit, and the second determining unit.

Those skilled in the art should understand that the embodiments of the present application may be provided as a method, a system, or a computer program product. Therefore, the present disclosure may use a form of hardware only embodiments, software only embodiments, or embodiments with a combination of software and hardware. Moreover, the present disclosure may be in a form of a computer program product that is implemented on one or more computer-usable storage media (including but not limited to a magnetic disk memory, a CD-ROM, an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, such that the instructions executed by a computer or a processor of another programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, such that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

The descriptions above are preferred implementations of the present disclosure. It should be noted that for those of ordinary skill in the art, various improvements and modifications can be made without departing from the principles of the present disclosure. These improvements and modifications should also be regarded as falling into the protection scope of the present disclosure.

The invention claimed is:

1. A power grid-friendly control method for a data center cooling system, comprising:
dividing an equipment room into a plurality of pieces of subspace in advance, with a plurality of servers and a cooling device comprised in each piece of subspace;
obtaining total power consumption of the servers in each piece of subspace;
performing priority sorting on the total power consumption of the servers in each piece of subspace based on a principle that lower total power consumption of the servers leads to a higher priority of turning off the cooling device; and
obtaining a real-time power supply energy consumption value of a power grid; determining, based on the real-time power supply energy consumption value of the power grid, whether an energy supply is sufficient;

when the energy supply is sufficient, skipping turning off the cooling device in the subspace; and when the energy supply is not sufficient, turning off a cooling device in corresponding subspace based on a priority sorting result, till it is determined that the energy supply is sufficient;

wherein the obtaining a real-time power supply energy consumption value of a power grid; determining, based on the real-time power supply energy consumption value of the power grid, whether an energy supply is sufficient; when the energy supply is sufficient, skipping turning off the cooling device in the subspace; and when the energy supply is not sufficient, turning off a cooling device in corresponding subspace based on a priority sorting result, till it is determined that the energy supply is sufficient, comprises:

obtaining a real-time supply voltage $V_{reduced}$ of the power grid and a preset supply voltage $V_{standard}$ in the case of normal power supply;

when the real-time supply voltage $V_{reduced}$ of the power grid is not less than the preset supply voltage $V_{standard}$ in the case of normal power supply, skipping turning off the cooling device in the voltage subspace; or when the real-time supply voltage $V_{reduced}$ of the power grid is less than the preset supply voltage $V_{standard}$ in the case of normal power supply, calculating a power consumption reduction value voltage $\Delta P_{reduce}$ according to the following formula:

$$\Delta P_{reduce} = \left(1 - \frac{V_{reduced}}{V_{standard}}\right) * P_{standard}$$

wherein $P_{standard}$ represents total power in the case of normal power supply; and determining, based on the power consumption reduction value $\Delta P_{reduce}$, the obtained total power consumption of the servers in each piece of subspace, and the priority sorting result, the cooling device that needs to be turned off in the subspace.

2. The power grid-friendly control method for a data center cooling system according to claim 1, wherein the dividing an equipment room into a plurality of pieces of subspace in advance, with a plurality of servers and a cooling device comprised in each piece of subspace, comprises:

dividing the equipment room into the plurality of pieces of subspace, dividing each piece of subspace into a plurality of pieces of server space by a position of the cooling device as a center, and adding the servers to different server space.

3. The power grid-friendly control method for a data center cooling system according to claim 1, wherein the determining, based on the power consumption reduction value $\Delta P_{reduce}$, the obtained total power consumption of the servers in each piece of subspace, and the priority sorting result, the cooling device that needs to be turned off in the subspace comprises:

if the priority sorting result is expressed as follows:

$L_{all} = [P_{air\ conditioner\_1}, P_{air\ conditioner\_2} \cdots P_{air\ conditioner\_N}]$ selecting k pieces of subspace in descending order of priorities in the priority sorting result, wherein the k pieces of subspace are as follows:

$L_k = [P_{air\ conditioner\_1}, P_{air\ conditioner\_2} \cdots P_{air\ conditioner\_k}];$ the following conditions are met:

$$\sum_{i=1}^{k} P_{air\ conditioner\_i} \geq \Delta P_{reduce}, \text{ and } \sum_{i=1}^{k-1} P_{air\ conditioner\_i} < \Delta P_{reduce};$$

$P_{air\ conditioner\_n}$ represents total power consumption of servers in subspace corresponding to an $n^{th}$ level, n=1, 2, ..., N, and N represents a level corresponding to a cooling device that is turned off last; and $$\sum_{i=1}^{k} P_{air\ conditioner\_i}$$

represents a sum of total power consumption of servers in the k pieces of subspace, and $$\sum_{i=1}^{k-1} P_{air\ conditioner\_i}$$

represents a sum of total power consumption of servers in (k−1) pieces of subspace.

4. A power grid-friendly control system for a data center cooling system, comprising:

a dividing module, configured to divide an equipment room into a plurality of pieces of subspace in advance, with a plurality of servers and a cooling device comprised in each piece of subspace;

a first obtaining module, configured to obtain total power consumption of the servers in each piece of subspace;

a sorting module, configured to perform priority sorting on the total power consumption of the servers in each piece of subspace based on a principle that lower total power consumption of the servers leads to a higher priority of turning off the cooling device; and a control module, configured to: obtain a real-time power supply energy consumption value of a power grid; determine, based on the real-time power supply energy consumption value of the power grid, whether an energy supply is sufficient; when the energy supply is sufficient, skip turning off the cooling device in the subspace; and when the energy supply is not sufficient, turn off a cooling device in corresponding subspace based on a priority sorting result, till it is determined that the energy supply is sufficient;

wherein the control module comprises:

a second obtaining unit, configured to obtain a real-time supply voltage $V_{reduced}$ of the power grid and a preset supply voltage $V_{standard}$ in the case of normal power supply;

a calculation unit, configured to: when the real-time supply voltage $V_{reduced}$ of the power grid is not less than the preset supply voltage $V_{standard}$ in the case of normal power supply, skip turning off the cooling device in the subspace; or when the real-time supply voltage $V_{reduced}$ of the power grid is less than the preset supply voltage $V_{standard}$ in the case of normal power supply, calculate a power consumption reduction value $\Delta P_{reduce}$ according to the following formula:

$$\Delta P_{reduce} = \left(1 - \frac{V_{reduced}}{V_{standard}}\right) * P_{standard}$$

wherein $P_{standard}$ represents total power in the case of normal power supply; and a determining unit, configured to determine, based on the power consumption reduction value $\Delta P_{reduce}$, the obtained total power consumption of the servers in each piece of subspace, and the priority sorting result, the cooling device that needs to be turned off in the subspace.

5. The power grid-friendly control system for a data center cooling system according to claim 4, wherein the dividing module is configured to divide the equipment room into the plurality of pieces of subspace, divide each piece of subspace into a plurality of pieces of server space by a position of the cooling device as a center, and add the servers to different server space.

6. The power grid-friendly control system for a data center cooling system according to claim 4, wherein the determining module comprises:

a third obtaining unit, configured to obtain the priority sorting result that is expressed as follows:

$$L_{all}=[P_{air\ conditioner\_1}, P_{air\ conditioner\_2} \cdots P_{air\ conditioner\_N}]; \text{ and}$$

a second determining unit, configured to determine k pieces of subspace in descending order of priorities in the priority sorting result, wherein the k pieces of subspace are as follows:

$$L_k=[P_{air\ conditioner\_1}, P_{air\ conditioner\_2} \cdots P_{air\ conditioner\_k}];$$

the following conditions are met:

$$\sum_{k=1}^{k} P_{air\ conditioner\_i} \geq \Delta P_{reduce}, \text{ and } \sum_{k=1}^{k-1} P_{air\ conditioner\_i} < \Delta P_{reduce};$$

$P_{air\ conditioner\_n}$ represents total power consumption of servers in subspace corresponding to an $n^{th}$ level, n=1, 2, ..., N, and N represents a level corresponding to a cooling device that is turned off last; and $$\sum_{k=1}^{k} P_{air\ conditioner\_i}$$

represents a sum of total power consumption of servers in the k pieces of subspace, and $$\sum_{k=1}^{k-1} P_{air\ conditioner\_i}$$

represents a sum of total power consumption of servers in (k−1) pieces of subspace.

* * * * *